United States Patent [19]

Wang

[11] Patent Number: 4,581,623

[45] Date of Patent: Apr. 8, 1986

[54] INTERLAYER CONTACT FOR USE IN A STATIC RAM CELL

[75] Inventor: Karl L. Wang, Austin, Tex.

[73] Assignee: Motorola, Inc., Schaumburg, Ill.

[21] Appl. No.: 613,549

[22] Filed: May 24, 1984

[51] Int. Cl.[4] .................... H01L 27/10; H01L 29/04; H01L 21/90

[52] U.S. Cl. .................... 357/23.7; 29/571; 29/576 J; 29/590; 357/42; 357/71; 357/59; 148/DIG. 19; 148/DIG. 147; 148/DIG. 164

[58] Field of Search .................. 29/571, 576 J, 577 C, 29/590, 591; 148/DIG. 19, DIG. 147, DIG. 164; 357/23.7, 42, 59, 67 S, 71 P, 71 S

[56] References Cited

U.S. PATENT DOCUMENTS

| | | | |
|---|---|---|---|
| 4,378,628 | 4/1983 | Levinstein et al. | 29/591 X |
| 4,398,335 | 8/1983 | Lehrer | 29/577 C |
| 4,467,518 | 8/1984 | Bansal et al. | 29/576 J X |

Primary Examiner—Brian E. Hearn
Assistant Examiner—Alan E. Schiavelli
Attorney, Agent, or Firm—Anthony J. Sarli, Jr.; Jeffrey Van Myers; James L. Clingan, Jr.

[57] ABSTRACT

A CMOS static RAM, which has P channel transistors formed in a second polysilicon layer, N channel transistors formed in the substrate, and gates of both the N channel and P channel transistors formed in a first polysilicon layer, requires that ohmic contact be made between semiconductor material of differing conductivity type. The first polysilicon layer is N-type, and the second polysilicon layer is P-type. Ohmic contact therebetween is achieved by providing a silicide layer which is between these two layers and in physical contact with both. Ohmic contact between N-type regions in the substrate and the second polysilicon layer is similarly achieved by sandwiching silicide therebetween.

3 Claims, 8 Drawing Figures

INTERLAYER CONTACT FOR USE IN A STATIC RAM CELL

FIELD OF THE INVENTION

The present invention relates to interlayer contacts, and more particularly, to interlayer contacts which can be used in a CMOS static RAM cell.

BACKGROUND OF THE INVENTION

CMOS static RAM cells are known to provide power advantages over a static RAM cell which uses polysilicon load resistors. Because the polysilicon load can be placed on top of the N channel transistors, static RAMs with polysilicon loads have been significantly more dense than designs with CMOS cells. CMOS cells have recently been developed which use the overlying polysilicon layer to form a P channel transistor, albeit, a relatively poor transistor in terms of its transconductance. This P channel device is then used as the load in place of the polysilicon resistor. This seemed to offer the potential of having both the power advantage of CMOS and the density advantage of polysilicon resistors for the loads.

A problem in this regard, however, is how to make good ohmic contact between polysilicon layers and to the source/drain N type regions in the substrate. The P channel polysilicon device is P type whereas, the underlying polysilicon layer which is used for gates of N channel devices in the cells, is N type. This underlying polysilicon layer is doped to N type both before and at the same time as the source/drains are doped. Consequently, bringing the upper P type polysilicon layer in contact with the underlying N type polysilicon layer and/or the N type source/drain region forms a PN junction instead of the needed ohmic contact. One technique to make this contact is to use an aluminum contact to the desired source/drain in the substrate. Both the P and N type polysilicon layers are also brought into contact with this aluminum, making ohmic contact thereto. Consequently, the ohmic contact is achieved by the P type layer, N type layer, and the source/drain region each being in ohmic contact with this aluminum. This type of contact has a significant detrimental affect on density. Because aluminum metal lines must be used extensively in the array for optimizing performance, the room required for an extra metal contact adversely affects cell density in a significant way.

SUMMARY OF THE INVENTION

An object of the subject invention is to provide an improved CMOS SRAM cell.

Another object of the invention is to obtain an improved ohmic contact between first and second polysilicon layers of opposite conductivity types.

Yet another object of the invention is to provide an improved ohmic contact between a first polysilicon layer, a second polysilicon layer, and a doped portion of a substrate.

These and other objects are achieved in a method of forming a contact in an integrated circuit between a first polysilicon layer and a second polysilicon layer comprising the steps of:
applying a gate insulator layer to a substrate;
applying a first polysilicon layer over the gate insulator layer;
applying an interlayer insulator layer over the first polysilicon layer;
etching a portion of the interlayer insulator at least at a location where the contact is to be formed to expose the first polysilicon layer at said contact location;
forming silicide at least at a portion of the exposed first polysilicon layer at the contact location; and
applying a second layer of polysilicon whereby ohmic contact is made between the first polysilicon layer and the second polysilicon layer via the silicide at the contact location.

DESCRIPTION OF THE INVENTION

Figure 1:
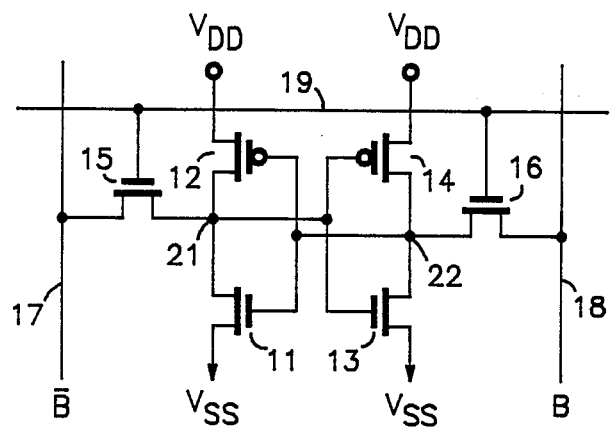
FIG. 1 is a circuit diagram of a conventional CMOS static RAM cell which is known in the prior art.

Shown in FIG. 1 is a conventional circuit diagram of a static RAM cell 10 comprised of an NMOS transistor 11, a PMOS transistor 12, an NMOS transistor 13, a PMOS transistor 14, an NMOS transistor 15, and an NMOS transistor 16. Transistors 15 and 16 operate as pass transistors utilizing the bilateral nature of MOS transistors by which the drain and source function of first and second current electrodes are interchangeable. Bit lines 17 and 18 are for providing a data bit in complementary signal form to or from cell 10. A word line 19 is for carrying a signal which will enable cell 10 for receiving or outputting a data bit.

Transistor 11 has a source connected to a negative power supply terminal VSS which is typically ground, a drain connected to a node 21, and a gate connected to a node 22. Transistor 12 has a source connected to a positive power supply terminal VDD which is typically 5 volts, a drain connected to node 21, and a gate connected to node 22. Transistor 13 has a source connected to VSS, a drain connected to node 22, and a gate connected to node 21. Transistor 14 has a source connected to VDD, a drain connected to node 22, and a gate connected to node 21. Transistor 15 has a first current electrode connected to node 21, a second current electrode connected to bit line 17, and a control electrode connected to word line 19. Transistor 16 has a first current electrode connected to node 22, a second current electrode connected to bit line 18, and a control electrode connected to word line 19.

Figure 2:
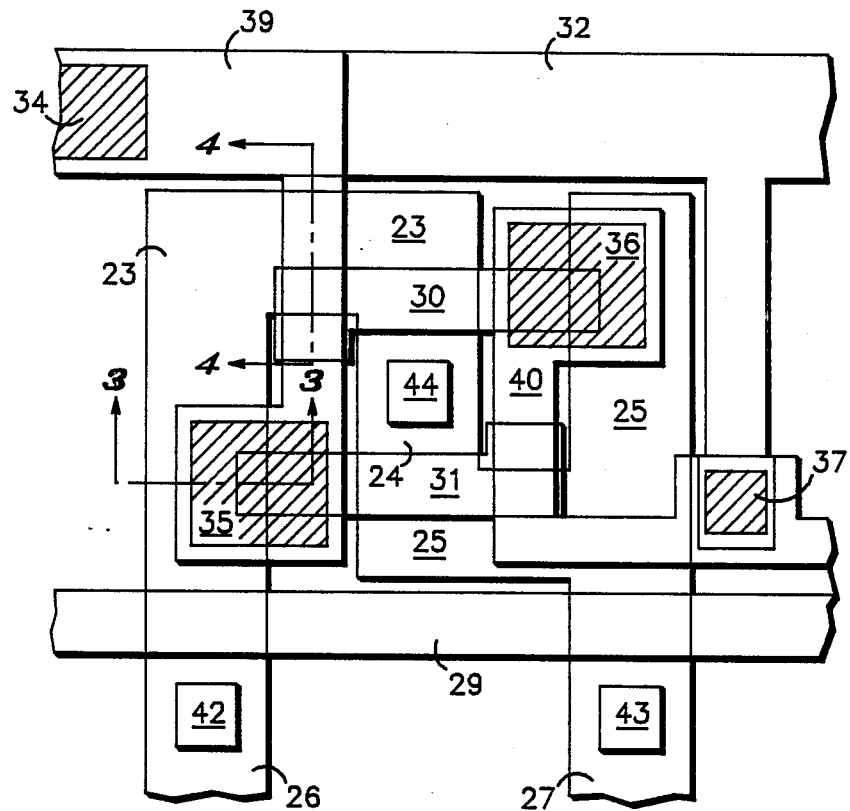
FIG. 2 is a novel layout of the static RAM cell of FIG. 1 according to a preferred embodiment of the invention.

Shown in FIG. 2 is a layout of cell 10 which is unique and incorporates ohmic connections between P and N material which avoids some of the problems of the prior art. A cross section taken at III—III, shown in FIGS. 3A–3E, depicts this P to N ohmic connection of node 22 of FIG. 1. In FIG. 2 regions 23, 24, 25, 26, and 27, depicted with cross-hatching that runs from upper left to lower right, are N+ regions in a P-substrate (not shown in layout FIG.2). Region 23 is the drain of transistor 13 and the first current electrode of transistor 16, region 24 is the source of transistor 13 and the source of transistor 11, region 25 is the drain of transistor 11 and the first current electrode of transistor 15, region 26 is the second current electrode of transistor 16, and region 27 is the second current electrode of transistor 15. Regions 29, 30, 31, and 32 are formed as first polysilicon layers of N+. Region 29 is word line 19 and the gates of transistors 15 and 16. Region 30 is the gate of transistor 13. Region 31 is the gate of transistor 11. Region 32 is VDD. Dotted line regions 34, 35, 36, and 37 mark masking areas for forming silicide regions for making the P to N ohmic contacts. Regions 39 and 40 are each a portion of a second layer of polysilicon. Transistor 14 is formed in region 39. Transistor 12 is formed in region 40. Regions 39 and 40 are P+ except in certain areas overlying regions 30 and 31, respectively, which are N−. Regions 42, 43, and 44, enclosed by solid lines are aluminum contacts for bit lines 18 and 17, and for VSS, respectively. Aluminum lines for VSS and bit lines 17 and 18, not shown in FIG. 2, would run in parallel from top to bottom over their respective contacts 44, 42, and 43. Cell 10 is of course just one cell in an array of cells. Cells which are mirror images of cell 10 would be on each of its four sides.

Figure 3A:
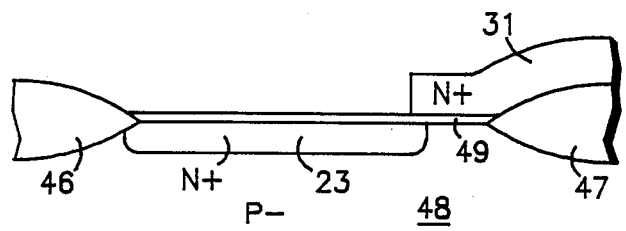
FIGS. 3A–3E are each a cross-section of a portion of the static RAM cell laid out in FIG. 2 depicting various stages in processing according to the preferred embodiment of the invention.
Figure 3B:
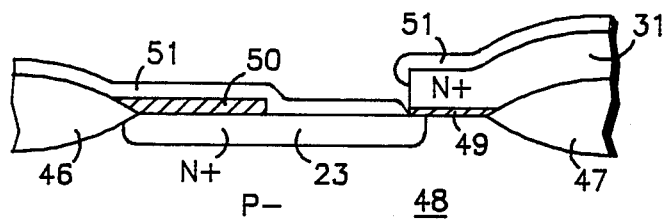
Figure 3C:
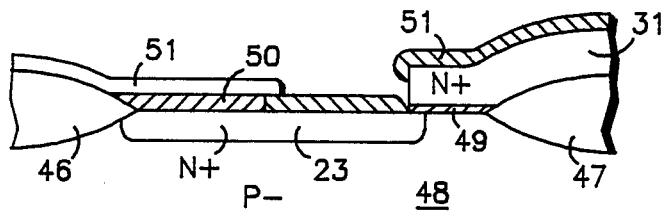
Figure 3D:
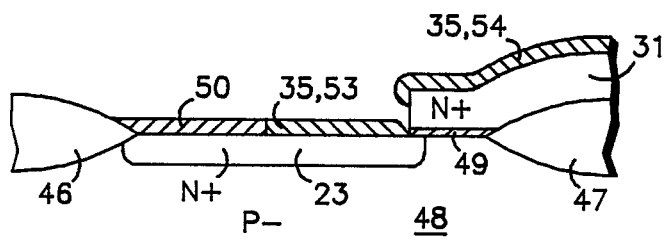
Figure 3E:
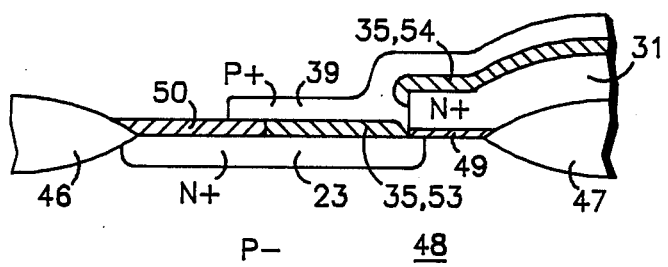

The cross-section, taken at III—III of FIG. 2 and shown in FIG. 3E, shows the ohmic connection of node 22 of FIG. 1. FIG. 3A shows this cross-section of node 22 at an earlier stage in the processing. Field oxide regions 46 and 47 have region 23 of N+ and a portion of P− in a substrate 48 between them. A thin gate oxide, of for example 250 Angstroms, is then formed in active regions such as that between field oxide regions 46 and 47. A polysilicon layer, of for example 5000 Angstroms, is then applied and doped to N+ using a phosphorus diffusion source. The polysilicon layer is etched leaving a thin oxide region 49 and region 31. Region 31 is then used as a mask so that region 23 is formed in an arsenic doping process step. This is a conventional self-aligning technique for CMOS. An interlayer oxide is then formed over cell 10 of FIG. 2. This interlayer oxide is primarily to insulate first and second polysilicon layers from each other. This interlayer oxide and oxide layer 49 are then etched at least in areas where ohmic contact to a second polysilicon layer is to be made which results in an oxide region 50 extending from field oxide 46 over a portion of region 23 as shown in FIG. 3B. This interlayer oxide is etched in regions 34, 35, 36 and 37 as shown in FIG. 2. Portions of regions 35 and 36 overlie field oxide which are not etched through to the substrate by this oxide etch. A refractory metal, such as titanium, is then deposited, shown as a layer 51. Heat is then applied so that the titanium reacts with silicon in those areas in which titanium layer 51 is in contact with silicon, in this case a portion of region 23 and the portion of region 31 shown in FIGS. 3A-3E. The resulting titanium silicide in region 35 has a portion 53 overlying exposed portion of region 23 and a portion 54 which overlies region 31 in FIG. 3C. The remaining unreacted titanium layer 51 is removed by an etchant which selects between titanium and titanium silicide. This result is shown in FIG. 3D. Another technique has developed which can be used for achieving the silicide result shown in FIG. 3D. Tungsten is the refractory metal. This alternative does not require etching unreacted tungsten. The technique provides for the tungsten to be deposited only on exposed silicon with subsequent silicide formation thereat. The object is to provide silicide in physical contact with region 23 and with region 31 regardless of how obtained. Because portions 53 and 54 of region 35 are a silicide of a refractory metal, physical contact also makes ohmic contact instead of merely forming a P-N junction. With portion 53 of region 35 in physical contact with region 23, ohmic contact is also made. Likewise with portion 54 of region 35, ohmic contact is made to region 31. Subsequently, then, region 39 of polysilicon is applied by any conventional technique to region 35 at least in areas which overlie region 23 and region 31. Region 39 shown in FIG. 3E is the drain contact of P channel transistor 14 of node 22. This portion of region 39 is in physical contact with both portions 53 and 54 of region 35. Consequently, ohmic contact is made between region 39 and both portions 53 and 54 of region 35. Because regions 23 and 31 are in ohmic contact with portions 53 and 54, respectively, of region 35, regions 23 and 31 are in ohmic contact with region 39. Regions 23 and 31 are also in ohmic contact with each other via region 39. Additionally, region 39 solves a potential step coverage problem associated with refractory metal at a substrate-polysilicon boundary.

Ohmic contacts necessary to obtain the connections for node 22 of FIG. 1 are thus shown in FIG. 3E. Ohmic contacts for node 21 are made in the same way using silicide region 36 to contact N+ region 25, N+ polysilicon region 30, and P+ polysilicon region 40. Two other ohmic contacts which must be made between P+ and N+ polysilicon layers are the source to VDD connections of transistors 12 and 14. The source connection for transistor 14 is facililated by silicide region 34. Region 34 is sandwiched between P+ polysilicon region 39 and N+ polysilicon region 32 in the same manner as portion 54 of silicide region 35 is sandwiched between N+ polysilicon layer 31 and P+ polysilicon layer 39. In the case of transistor 12 the source to VDD conection is made by silicide region 37 having a portion sandwiched between N+ polysilicon region 32 and P+ polysilicon region 40.

Ordinarily, obtaining a first polysilicon layer to second polysilicon layer contact is not a problem because these two layers are ordinarily of the same conductivity type. But with first and second polysilicon layers being of opposite conductivity types, a technique had to be developed to obtain a device structure which allowed for ohmic contact between first and second polysilicon layers of opposing conductivity type. In addition, ohmic contact also had to be made to a doped region in a substrate by the first and second polysilicon layers. An advantage of the device structure shown in FIG. 3E is that no provision is necessary for obtaining physical contact between first polysilicon layer 31 and doped region 23 to obtain ohmic contact therebetween. Ohmic contact between first polysilicon, such as layer 31, and the doped region, such as region 23 is referred to as a buried contact which, when used, adds to processing complexity. Although additional processing steps relating to the silicide are required for establishing ohmic contact between the first and second polysilicon layers of opposing conductivity types, the additional processing steps associated with buried contacts, however, are not required. Since a buried contact is generally assumed to be required in the manufacture of a static RAM, process complexity for the technique described herein is increased in some respects but decreased in others. If buried contact capability is nonetheless available because, for example, some other portion of the circuit requires it, layer 31 could easily be made to contact region 23. In which case portion 53 of silicide region 35 would not be required because ohmic contact between region 23 and layer 31 would be established.

Ohmic contact to layer 39 would then be made via only portion 54 of silicide region 35.

Figure 4:
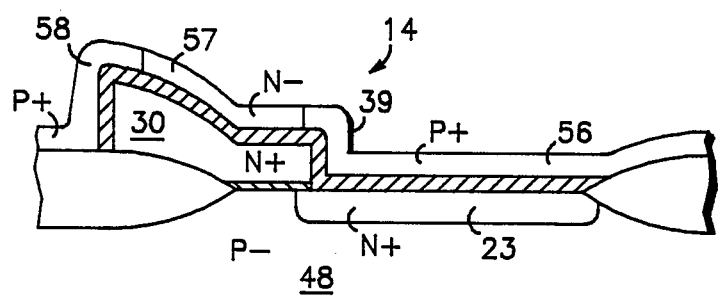
FIG. 4 is a cross-section of a portion of the static RAM cell laid out in FIG. 2.

Shown in FIG. 4 is a cross section taken at IV—IV of FIG. 2. This shows P channel transistor 14 and a portion of N channel transistor 13. Transistor 14 is formed in region 35 of the second polysilicon layer. The source of transistor 14 is a P+ region 56. The channel is a N− region 57. The drain is a P+ region 58. The gate is underlying region 30 of the first polysilicon layer. Another portion of region 30, not shown in FIG. 4 but shown in FIG. 2 is also the gate of transistor 13. N+ region 23 is also shown in FIG. 4. Transistor 12 is formed in similar fashion to that shown for transistor 14 shown in FIG. 4. As stated previously, forming a P channel transistor in a second layer of polysilicon while utilizing a first polysilicon layer for the gate is in the prior art. The particular layout, device structures, and method for obtaining this layout and device structures are not. The device structures shown and described may have applicability beyond static RAMs. In other complex CMOS circuits differing portions of the first and second polysilicon layers have different conductivity types. If it is desirable to connect the first polysilicon layer to the second polysilicon layer at locations where these two layers have opposing conductivity types, an aluminum contact may be undesirable as it is in the case of static RAMs. Consequently, the technique described herein may be useful for obtaining such a first layer to second layer contact. Similarly, doped regions in a substrates may need to be connected to first and second layers of differing conductivity types, in which case the technique described herein may also be useful.

I claim:

1. A CMOS static RAM cell formed in a semiconductor substrate, comprising:

a first N channel transistor having a drain formed in a first region of a first conductivity type in the substrate, a source formed in a second region of the substrate and coupled to a first power supply terminal, and a gate formed in a first portion of a first polysilicon layer of the first conductivity type;

a first P channel transistor having a drain formed in a first portion of a second polysilicon layer of a second conductivity type and in ohmic contact with the drain of the first N channel transistor, a source formed in a second portion of the second polysilicon layer and coupled to a second power supply terminal, and a gate formed in the first portion of the first polysilicon layer in common with the gate of the first N channel transistor;

a second N channel transistor having a drain formed in a third region of the first conductivity type in the substrate and coupled to the gate of the first N channel transistor and the first P channel transistor, a source formed in the second region of the substrate and coupled to the first power supply terminal, and a gate formed in a second portion of the first polysilicon layer of the first conductivity type and in ohmic contact with the drain of the first P channel transistor; and a second P channel transistor having a source formed in a third portion of the second polysilicon layer and coupled to the second power supply terminal, a drain formed in a fourth portion of the second polysilicon layer and coupled to the drain of the second N channel transistor, and a gate formed in common with the gate of the second N channel transistor;

wherein the ohmic contact between the gates of the second N and P channel transistors and the drain of the first P channel transistor is obtained by having a first portion of a silicide layer sandwiched between at least a portion of the first portion of the second polysilicon layer and at least a portion of the second portion of the first polysilicon layer.

2. The CMOS static RAM cell of claim 1 wherein the ohmic contact between the first region of the substrate and the first portion of the second polysilicon layer is formed by having a second portion of the silicide layer sandwiched between at least a portion of the first portion of the second polysilicon layer and at least a portion of the first region of the substrate.

3. The CMOS static RAM cell of claim 2 wherein the silicide layer is titanium silicide.

* * * * *